US009425394B2

(12) United States Patent
Butcher et al.

(10) Patent No.: US 9,425,394 B2
(45) Date of Patent: Aug. 23, 2016

(54) DOPED OXIDE DIELECTRICS FOR RESISTIVE RANDOM ACCESS MEMORY CELLS

(71) Applicants: Intermolecular Inc., San Jose, CA (US); Kabushiki Kaisha Toshiba, Tokyo (JP); SanDisk 3D LLC, Milpitas, CA (US)

(72) Inventors: Brian Butcher, San Jose, CA (US); Randall J. Higuchi, San Jose, CA (US); Yun Wang, San Jose, CA (US)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 6 days.

(21) Appl. No.: 14/565,712

(22) Filed: Dec. 10, 2014

(65) Prior Publication Data

US 2015/0093876 A1   Apr. 2, 2015

Related U.S. Application Data

(63) Continuation-in-part of application No. 14/016,775, filed on Sep. 3, 2013, now Pat. No. 8,883,557.

(51) Int. Cl.
*H01L 45/00* (2006.01)
*H01L 27/24* (2006.01)

(52) U.S. Cl.
CPC ........... *H01L 45/1616* (2013.01); *H01L 45/08* (2013.01); *H01L 45/1233* (2013.01); *H01L 45/1253* (2013.01); *H01L 45/146* (2013.01); *H01L 45/1641* (2013.01); *H01L 27/2481* (2013.01)

(58) Field of Classification Search
CPC ...................... H01L 45/1616; H01L 45/1641
See application file for complete search history.

(56) References Cited

U.S. PATENT DOCUMENTS

| 2007/0134942 | A1* | 6/2007 | Ahn | H01L 21/28185 438/785 |
| 2007/0232081 | A1* | 10/2007 | Kil | C23C 16/405 438/785 |
| 2009/0057738 | A1* | 3/2009 | Hirota | C23C 16/405 257/296 |
| 2010/0302705 | A1* | 12/2010 | Antonov | H01G 4/1209 361/313 |

* cited by examiner

*Primary Examiner* — Daniel Whalen
*Assistant Examiner* — Suberr Chi

(57) ABSTRACT

Provided are methods of fabricating memory cells such as resistive random access memory (ReRAM) cells. A method involves forming a first layer including two high-k dielectric materials such that one material has a higher dielectric constant than the other material. In some embodiments, hafnium oxide and titanium oxide form the first layer. The higher-k material may be present at a lower concentration. In some embodiments, a concentration ratio of these two high-k materials is between about 3 and 7. The first layer may be formed using atomic layer deposition. The first layer is then annealed in an oxygen-containing environment. The method may proceed with forming a second layer including a low-k dielectric material, such as silicon oxide, and forming an electrode. After forming the electrode, the memory cell is annealed in a nitrogen containing environment. The nitrogen anneal may be performed at a higher temperature than the oxygen anneal.

20 Claims, 5 Drawing Sheets

Initial Forming

Operational Switching

DOPED OXIDE DIELECTRICS FOR RESISTIVE RANDOM ACCESS MEMORY CELLS

CROSS-REFERENCE TO RELATED APPLICATIONS

This application is a continuation-in-part of U.S. application Ser. No. 14/016,775, entitled "CONTROLLING COMPOSITION OF MULTIPLE OXIDES IN RESISTIVE SWITCHING LAYERS USING ATOMIC LAYER DEPOSITION," filed on Sep. 3, 2013, which is incorporated herein by reference in its entirety for all purposes.

BACKGROUND

Nonvolatile memory is computer memory capable of retaining stored information even when unpowered. Nonvolatile memory is typically used for secondary storage or long-term persistent storage and may be used in addition to volatile memory, which loses the stored information when unpowered. Nonvolatile memory can be permanently integrated into computer systems (e.g., solid state hard drives) or can take the form of removable and easily transportable memory cards (e.g., USB flash drives). Nonvolatile memory is becoming more popular because of its small size/high density, low power consumption, fast read and write rates, retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory, are being developed to meet these demands and requirements.

SUMMARY

Provided are methods of fabricating memory cells such as resistive random access memory (ReRAM) cells. A method involves forming a first layer including two high-k dielectric materials such that one material has a higher dielectric constant than the other material. In some embodiments, hafnium oxide and titanium oxide form the first layer. The higher-k material may be present at a lower concentration. In some embodiments, a concentration ratio of these two high-k materials is between about 3 and 7. The first layer may be formed using, for example, atomic layer deposition (ALD) or chemical vapor deposition (CVD). The first layer is then annealed in an oxygen containing environment. The method may proceed with forming a second layer including a low-k dielectric material, such as silicon oxide, and forming an electrode. After forming the electrode, the memory cell is annealed in a nitrogen containing environment. The nitrogen anneal may be performed at a higher temperature than the oxygen anneal.

In certain embodiments, a method of fabricating a memory cell comprises forming a first layer using ALD or CVD techniques. The first layer includes a first dielectric material and a second dielectric material. The dielectric constant of the first dielectric material is less than the dielectric constant of the second dielectric material. Furthermore, the concentration of the first dielectric material in the first layer is greater than the concentration of the second dielectric material in the first layer. The method may proceed with annealing the first layer in a first environment including an oxygen source. After this annealing (i.e., annealing the first layer in the first environment) forming a second layer over the first layer. The second layer is operable as an electrode. The method then proceeds with annealing the first layer and the second layer in a second environment including a nitrogen source. The memory cell, once fabricated, is operable to switching between two resistive states when a switching signal is applied to the memory cell.

In some embodiments, the second layer can be formed directly over the first layer such that the second layer directly interfaces the first layer. Alternatively, the method may also involve, prior to forming the second layer, the step of forming a third layer over the first layer such that the third layer is disposed between the second layer and the first layer. The third layer includes a third dielectric. The dielectric constant of the third dielectric material is less than the dielectric constant of the first dielectric material. In some embodiments, the dielectric constant of the third dielectric material is at least three times less than the dielectric constant of the first dielectric material. The third dielectric material may include silicon oxide. The thickness of the third layer is less than the thickness of the second layer. In some embodiments, the thickness of the third layer is between about 5 Angstroms and 20 Angstroms.

In some embodiments, the dielectric constant of the first dielectric material is at least about 20. The first dielectric material may be hafnium oxide. The second dielectric material may be one of titanium oxide or tantalum oxide. The thickness of the first layer is between about 20 Angstroms and 100 Angstroms. In some embodiments, the concentration ratio of the first dielectric material to the second dielectric material in the first layer is between about 3 and 7. At least one of the first dielectric material or the second dielectric material may include a non-stoichiometric oxide.

In some embodiments, the first layer is formed using ALD. In these embodiments, forming the first layer may involve forming one of more sub-layers of the first dielectric material and one or more sub-layers of the second dielectric material. The first layer may be formed over a layer including titanium nitride. This titanium nitride containing layer may be operable as a second electrode. In some embodiments, the second layer includes tantalum nitride.

In yet more embodiments, annealing of the first layer in the first environment is performed at the temperature of between about 500° C. and 700° C. The oxygen source present in the first environment may be molecular oxygen. In some embodiments, annealing of the first layer and the second layer in the second environment is performed at the temperature of about 700° C. and 800° C.

In some embodiments, a method of fabricating a memory cell which involves forming a first layer using ALD. The first layer is formed over a layer containing titanium nitride, the titanium nitride being operable as a first electrode. The first layer includes hafnium oxide and titanium oxide. The concentration ratio of hafnium oxide to titanium oxide in the first layer may be between about 3 and 7. The thickness of the first layer may be between about 20 Angstroms and 100

Angstroms. The method may proceed with annealing the first layer in a first environment including oxygen. This annealing may be performed at a temperature of 500° C. for about 1 minute. After annealing the first layer in the first environment, the method may proceed with forming a second layer over the first layer. The second layer includes silicon oxide. The thickness of the second layer may be between about 5 Angstroms and 20 Angstroms. After forming the second layer, the method may proceed with forming a third layer over the second layer. The third layer includes tantalum nitride. The third layer is operable as a second electrode. The method may proceed with annealing the first layer, second layer, and third layer in a second environment including molecular nitrogen. This anneal of the multiple layer is performed at a temperature of about 750° C. for about 1 minute.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings.

DETAILED DESCRIPTION

Figure 1A:
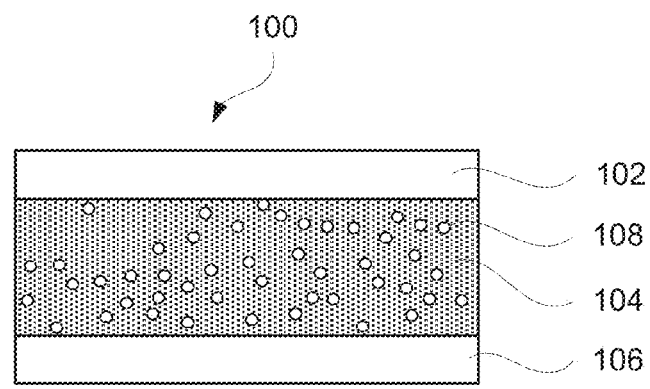
FIG. 1A illustrates a schematic representation of a ReRAM cell prior to initial forming operation, in accordance with some embodiments.

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Introduction

A ReRAM cell exhibiting resistive switching characteristics generally includes multiple layers formed into a stack, such as a "metal-insulator-metal" (MIM) stack. The stack includes two conductive layers operating as electrodes, which are identified as "M" and may include a metal, but may also include other types of conductive materials, such as doped silicon. The stack also includes an insulator layer provided in between the two electrodes and identified as "I". The insulator layer changes its resistive properties when certain switching voltages are applied to the layer or, more generally, to the ReRAM cell including this layer. Due to its variable resistance characteristics, the insulator layer may be also referred to as a variable resistance layer. These changes in resistive properties are used to store data. For example, when two different resistive states are identified (e.g., a high resistive state and a low resistive state) for a ReRAM cell, one state may be associated with a logic "zero", while the other state may be associated with a logic "one" value. Similar approaches may be used when three or more resistive states may be identified for the same ReRAM cell leading to various multibit architectures.

The switching voltages may be applied as series of pulses and may be generally referred to as switching voltage profiles or, more specifically, set voltage profiles and reset voltage profiles. For example, a switching voltage pulse may be used to change ("set" or "reset") the resistive state followed by a smaller reading voltage pulse to determine the current state of the ReRAM cell at that time. Unlike the switching voltage pulse, the reading pulse is specifically configured to avoid changing the resistive state of the ReRAM cell and is configured only to determine the current state. The switching pulse may be repeated if the desired resistive state is not reached. The switching pulses may alternate with the reading pulses for feedback control. The switching pulses may vary from one to another based on their potential (e.g., a gradual increase in the potential), duration, and other characteristics. The reading pulses may be the same. The process of applying the switching pulses and reading pulses may continue until the desired resistive state is reached.

Various theoretical models have been proposed to characterize this resistive switching phenomenon. Some of these models are described below. Different approaches of tailoring resistive switching characteristics, such as reducing switching voltages, have been undertaken. Without being restricted to any particular theory, it is believed that distribution of oxygen vacancies and electrochemical migration of the oxygen vacancies play a key role in resistive switching in resistive switching layers that are formed from oxides, such as transition metal oxides, silicon oxides, and other suitable oxides.

Combining two oxides in the same resistive switching layer has yielded promising results. For example, two elements having different electro-negativities, such as hafnium oxide and titanium oxide, may be combined in the same resistive switching layer. The two elements compete for oxygen within the resistive switching layer. The oxide layers of these elements may form one or more interfaces within the resistive switching layer. These interfaces are believed to be responsible for forming or breaking conductive filaments which are also discussed below in greater detail. Distribution of the two oxides with the resistive switching layer, thicknesses of the layers of these oxides, stoichiometry and other physical characteristics may be tuned to achieve desirable resistive switching, repeatability, and performance characteristics of the ReRAM cell.

Some methods for manufacturing resistive switching layers for ReRAM cells involve depositing layers containing, for example, hafnium and titanium and subsequently annealing of the deposited layers in an oxygen containing environment to form hafnium oxide and titanium oxide layers, respectively. The anneal process is typically performed at temperatures between 500° C. and 700° C., for example, which effectively forms a resistive switching layer. The resistive switching layer can be later subjected to a forming voltage to form initial conductive paths through therein.

When the anneal temperatures are greater than about 500° C. or even greater than about 550° C., the ReRAM cells later experience a significant improvement in switching yield, data retention, and endurance performance. Without being restricted to any particular theory, it is believed that the high temperature annealing may cause a significant re-ordering of the atoms within previously deposited layer in accordance, for example, with the long-range order. Single, bi-, and multi-layer metal-oxide stack-combinations for ReRAM cells have shown increased crystallization after high temperature annealing. This increased crystallization subsequently reduces leakage currents causing an increase in the required forming voltage, which is undesirable. In particular, the increase of the forming voltage may reduce the overall performance of the ReRAM cell performance and makes the peripheral circuit design more challenging.

Methods of fabricating ReRAM cells described herein form the cells with lower forming voltages in comparison to conventional cells thereby reducing the forming power and improving subsequent performance of the cells, such as switching yield, retention and endurance. These ReRAM cells may have one or more resistive switching layers, each layer formed by two high-k dielectric materials. Notably, one material has a higher dielectric constant than the other one. In some embodiments, hafnium oxide and titanium oxide form a layer, although other high-k materials can be also used such as hafnium silicate, zirconium silicate, zirconium dioxide, and so forth. The higher-k material may be present at a lower concentration in the formed layer. In some embodiments, a concentration ratio of these two high-k materials is between about 3 and 7. The layer may be formed using ALD, although other deposition methods can be used such as CVD. The deposited layer is then annealed in an oxygen containing environment. The method may proceed with forming another layer, e.g., a second layer, including a low-k dielectric material, such as silicon oxide. Furthermore, an electrode is formed over one or two layers. Another electrode may be disposed under the initially deposited layer. After forming the electrode, the memory cell may be annealed in a nitrogen containing environment. The nitrogen anneal may be performed at a higher temperature than the oxygen anneal.

Without being restricted to any particular theory, it is believed that high-k dielectric materials can reduce electrical breakdown strength ($E_{bd}$) of resistive switching layers in ReRAM cells such that the forming voltages can be also reduced. However, even if high-k dielectric materials are used, there still can be a high probability of metal-oxygen bond breakdown. In general, this breakdown is the function of material's relative dielectric permittivity (k value) and dipole moment of the polar metal-oxide bond ($p_0$). Accordingly, controlling the fast transient of the metal-oxygen bond breakage by reducing the electrical breakdown strength may be used in some embodiments. For example, instead of using hafnium oxide to form an entire resistive switching layer, hafnium oxide may be doped with titanium forming hafnium-titanium-oxide (HTO). As further described below, the HTO layer lowers the overall materials electrical-breakdown-field making ReRAM cells more reliable and stable in comparison, for example, with ReRAM cells using hafnium oxide to form the entire resistive switching layer. The ReRAM cells with the HTO resistive switching layers also have higher switching yield, date retention, and endurance. Other combinations of materials may be also used. For example, some of transition metals can be used as dopants in hafnium oxide to achieve similar properties. In some embodiments, titanium, zirconium, and/or hafnium can be used as a dopant in transition metal oxides.

Equation 1 presented below illustrates the dependency of breakdown rate G (i.e., vacancy generation rate) as a characteristic of vibration frequency Go:

$$G = G_0 * e^{-q*\left(\frac{E_o - \beta *[F_{ext}]}{K_b * T}\right)} \quad \text{(Equation 1)}$$

where G is the breakdown rate, Go is a vibration frequency, $K_b$ is Boltzmann's constant, $E_a$ is the activation energy of dielectric breakdown, $F_{ext}$ is the applied electrical field, T is the temperature, and $\beta$ is the material's polarization value. From this equation, it is apparent that lowering the $E_a$ value reduces the overall forming voltage.

$$\beta = p_0 \left(\frac{2+k}{3}\right) \quad \text{(Equation 2)}$$

where $p_0$ is the polar metal-oxide bond, and k is the material's relative dielectric permittivity.

As follows from the above equations, doping hafnium oxide with a metal, such as titanium, increases the overall polarization, which acts to enhance the applied electrical field's effect of the material. Accordingly, the lower applied voltages reduce the electrical breakdown field, which finally reduces the forming voltage. Therefore, using HTO in resistive switching layer significantly improves characteristics of ReRAM cells as outlined above in comparison, for example to using un-doped hafnium oxide.

Moreover, doping hafnium oxide with titanium or another transition metal suppresses material crystallinity. This crystallization suppression resulting in more amorphous materials subsequently improves (i.e., reduces) the overall leakage currents in the resistive switching layer causing the decrease in the required breakdown energy and forming voltages. For example, doping of hafnium oxide with titanium can be responsible for creating poly-crystalline after a high temperature anneal rather than highly crystalline, which is yielded when hafnium oxide is not doped. Poly-crystalline (as opposed to highly crystalline) materials act to trap more defects along the grain boundaries creating more leakage paths. This increase of leakage current in the doped hafnium oxide leads to improvement in switching yield, retention, and endurance performance as demonstrated in the "Experimental Results" section below.

Examples of Nonvolatile ReRAM Cells and their Switching Mechanisms

A brief description of ReRAM cells is now provided for context and better understanding of various features associated with embedded resistors in the ReRAM cells. As stated above, a ReRAM cell includes a dielectric material formed into a layer exhibiting resistive switching characteristics. A dielectric, which is normally insulating, can be made to conduct through one or more conductive paths formed after application of a voltage. The conductive path formation can arise from different mechanisms, including defects, metal migration, and other mechanisms further described below. Once one or more conductive paths (e.g., filaments) are formed in the dielectric component of a memory device, these conductive paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

FIG. 1A illustrates a schematic representation of ReRAM cell 100 including first electrode 102, second electrode 106, and resistive switching layer 104 disposed in between first electrode 102 and second electrode 106. It should be noted that the "first" and "second" references for electrodes 102 and 106 are used solely for differentiation and not to imply any processing order or particular spatial orientation of these electrodes. ReRAM cell 100 may also include other components, such as an embedded resistor, diode, diffusion barrier layer, and other components. ReRAM cell 100 is sometimes referred to as a memory element or a memory unit.

First electrode 102 and second electrode 106 may be used as conductive lines within a memory array or other types of devices that ReRAM cell is integrated into. As such, electrode 102 and 106 are generally formed from conductive materials. As stated above, one of the electrodes may be reactive electrode and act as a source and as a reservoir of defects for the resistive switching layer. That is, defects may travel through an interface formed by this electrode with the resistive switching layer (i.e., the reactive interface).

Resistive switching layer 104 which may be initially formed from a dielectric material and later can be made to conduct through one or more conductive paths formed within the layer by applying first a forming voltage and then a switching voltage. To provide this resistive switching functionality, resistive switching layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types all charge carriers are referred to as defects 108.

FIG. 1A is a schematic representation of ReRAM cell 100 prior to initial formation of conductive paths, in accordance with some embodiments. Resistive switching layer 104 may include some defects 108. Additional defects 108 may be provided within first electrode 102 and may be later transferred to resistive switching layer 104 during the formation operation. In some embodiments, the resistive switching layer 104 has substantially no defects prior to forming operation and all defects are provided from first electrode 102 during forming. Second electrode 106 may or may not have any defects. It should be noted that regardless of presence or absence of defects in second electrode 106, substantially no defects are exchanged between second electrode 106 and resistive switching layer 104 during forming and/or switching operations.

Figure 1B:
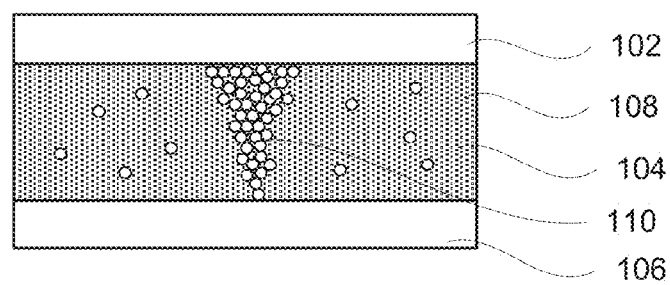
FIGS. 1B and 1C illustrate schematic representations of the ReRAM cell in its high resistive state (HRS) and low resistive state (LRS), respectively, in accordance with some embodiments.

During the forming operation, ReRAM cell 100 changes its structure from the one shown in FIG. 1A to the one shown in FIG. 1B. This change corresponds to defects 108 being arranged into one or more continuous paths within resistive switching layer 104 as, for example, schematically illustrated in FIG. 1B. Without being restricted to any particular theory, it is believed that defects 108 can be reoriented within resistive switching layer 104 to form these conductive paths as, for example, schematically shown in FIG. 1B. Furthermore, some or all defects 108 forming the conductive paths may enter the resistive switching layer 104 from first electrode 102. For simplicity, all these phenomena are collectively referred to as reorientation of defects within ReRAM cell 100. This reorientation of defects 108 occurs when a certain forming voltage is applied to electrodes 102 and 106. In some embodiments, the forming operation also conducted at elevated temperatures to enhanced mobility of the defects within ReRAM cell 100. In general, the forming operation is considered to be a part of the fabrication of ReRAM cell 100, while subsequent resistive switching is considered to be a part of operation of ReRAM cell.

Figure 1C:
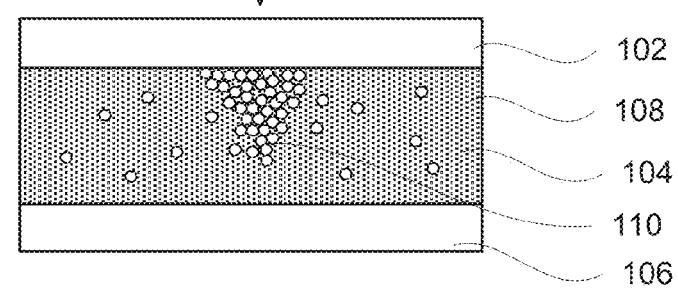

Resistive switching involves breaking and reforming conductive paths through resistive switching layer 104, i.e., switching between the state schematically illustrated in FIG. 1B and the state schematically illustrated in FIG. 1C. The resistive switching is performed by applying switching voltages to electrodes 102 and 106. Depending on magnitude and polarity of these voltages, conductive path 110 may be broken or formed back again. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of resistive switching layer 104 illustrated in FIG. 1B is referred to as a low resistance state (LRS), while the state illustrated in FIG. 1C is referred to as a high resistance state (HRS). The resistance difference between the LRS and HRS is due to different number and/or conductivity of conductive paths that exists in these states, i.e., resistive switching layer 104 has more conductive paths and/or less resistive conductive paths when it is in the LRS than when it is in the HRS. It should be noted that resistive switching layer 104 may still have some conductive paths while it is in the HRS, but these conductive paths are fewer and/or more resistive than the ones corresponding to the LRS.

When switching from its LRS to HRS, which is often referred to as a reset operation, resistive switching layer 104 may release some defects into first electrode 102. Furthermore, there may be some mobility of defects within resistive switching layer 104. This may lead to thinning and, in some embodiments, breakages of conductive paths as shown in FIG. 1C. Depending on mobility within resistive switching layer 104 and diffusion through the interface formed by resistive switching layer 104 and first electrode 102, the conductive paths may break closer to the interface with second electrode 106, somewhere within resistive switching layer 104, or at the interface with first electrode 102. This breakage generally does not correspond to complete dispersion of defects forming these conductive paths and may be a self-limiting process, i.e., the process may stop after some initial breakage occurs.

When switching from its HRS to LRS, which is often referred to as a set operation, resistive switching layer 104 may receive some defects from first electrode 102. Similar to the reset operation described above, there may be some mobility of defects within resistive switching layer 104. This may lead to thickening and, in some embodiments, reforming of conductive paths as shown in FIG. 1B. In some embodiments, a voltage applied to electrodes 102 and 106 during the set operation has the same polarity as a voltage applied during the reset operation. This type of switching is referred to as unipolar switching. Alternatively, a voltage applied to electrodes 102 and 106 during the set operation may have different polarity as a voltage applied during the reset operation. This type of switching is referred to as bipolar switching. Setting and resetting operations may be repeated multiple times as will now be described with reference to FIGS. 2A and 2B.

Figure 2A:
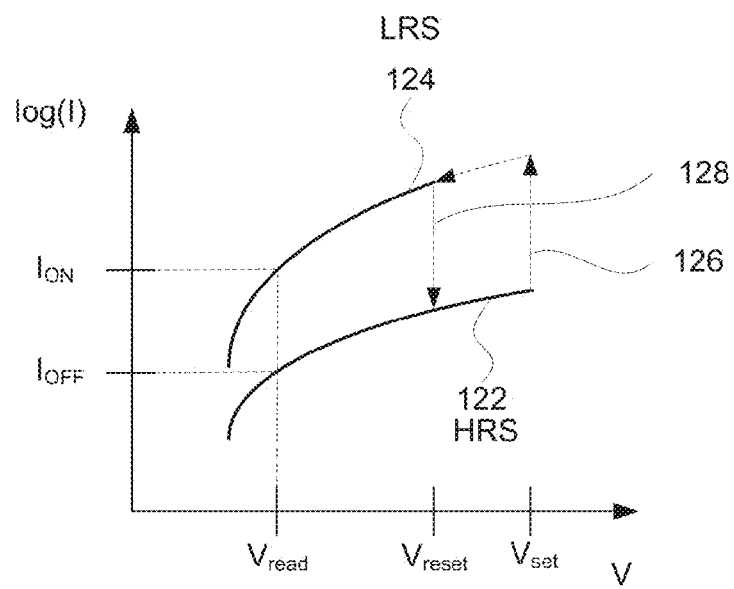
FIG. 2A illustrates a plot of a current passing through a unipolar ReRAM cell as a function of a voltage applied to the ReRAM cell, in accordance with some embodiments.
Figure 2B:
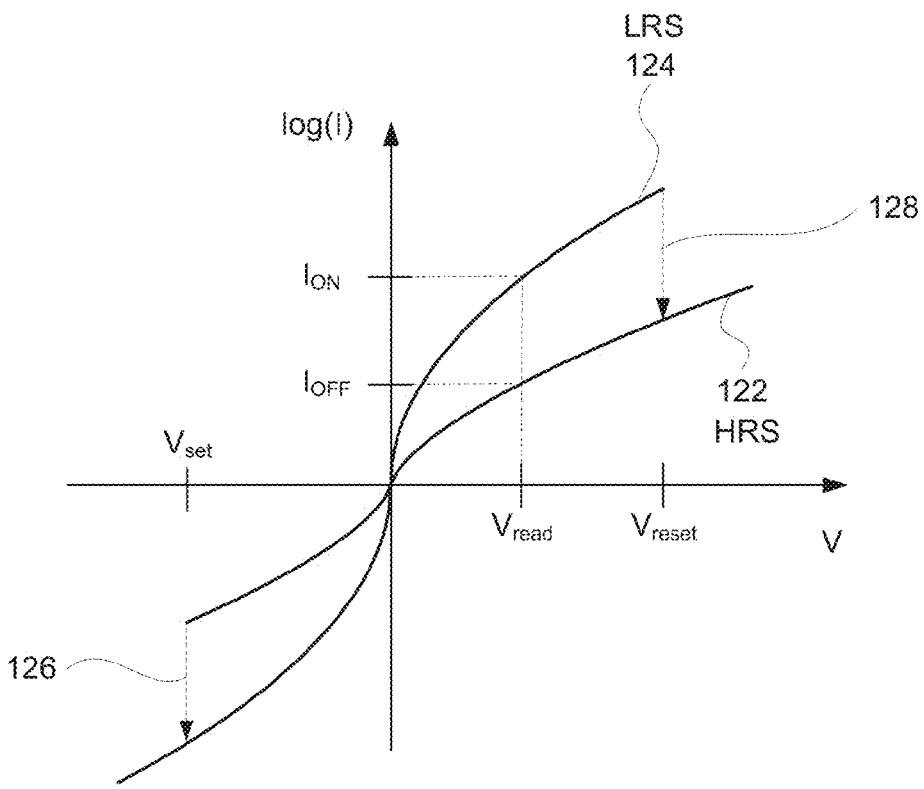
FIG. 2B illustrates a plot of a current passing through a bipolar ReRAM cell as a function of a voltage applied to the ReRAM cell, in accordance with some embodiments.

Specifically, FIG. 2A illustrates a plot of a current passing through a unipolar ReRAM cell as a function of a voltage applied to the ReRAM cell, in accordance with some embodiments. FIG. 2B illustrates the same type of a plot for a bipolar ReRAM cell, in accordance with some embodiments. The HRS is defined by line 122, while the LRS is defined by 124 in both plots. Each of these states is used to represent a different logic state, e.g., the HRS may represent logic one ("1") and LRS representing logic zero ("0") or vice versa. Therefore, each ReRAM cell that has two resistance states may be used to store one bit of data. It should be noted that some ReRAM cells may have three and even more resistance states allowing multi-bit storage in the same cell.

The overall operation of the ReRAM cell may be divided into a read operation, set operation (i.e., turning the cell "ON" by changing from its HRS to LRS), and reset operation (i.e., turning the cell "OFF" by changing from its LRS to HRS). During the read operation, the state of the ReRAM cell or, more specifically, the resistive state of its resistance of resistive switching layer can be sensed by applying a sensing voltage to its electrodes. The sensing voltage is sometimes referred to as a "READ" voltage or simply a reading voltage and indicated as $V_{READ}$ in FIG. 2A and FIG. 2B. If the ReRAM cell is in its HRS (represented by line 122 in FIGS. 2A and 2B), the external read and write circuitry connected to the electrodes will sense the resulting "OFF" current ($I_{OFF}$) that flows through the ReRAM cell. As stated above, this read operation may be performed multiple times without changing the resistive state (i.e., switching the cell between its HRS and LRS). In the above example, the ReRAM cell should continue to output the "OFF" current ($I_{OFF}$) when the read voltage ($V_{READ}$) is applied to the electrodes for the second time, third time, and so on.

Continuing with the above example, when it is desired to turn "ON" the cell that is currently in the HRS switch, a set operation is performed. This operation may use the same read and write circuitry to apply a set voltage ($V_{SET}$) to the electrodes. Applying the set voltage forms one or more conductive paths in the resistive switching layer as described above with reference to FIGS. 1B and 1C. The switching from the HRS to LRS is indicated by dashed line 126 in FIGS. 2A and 2B. The resistance characteristics of the ReRAM cell in its LRS are represented by line 124. When the read voltage ($V_{READ}$) is applied to the electrodes of the cell in this state, the external read and write circuitry will sense the resulting "ON" current ($I_{ON}$) that flows through the ReRAM cell. Again, this read operation may be performed multiple times without switching the state of the ReRAM cell.

At some point, it may be desirable to turn "OFF" the ReRAM cell by changing its state from the LRS to HRS. This operation is referred to as a reset operation and should be distinguished from the set operation during which the ReRAM cell is switched from its HRS to LRS. During the reset operation, a reset voltage ($V_{RESET}$) is applied to the ReRAM cell to break the previously formed conductive paths in the resistive switching layer. Switching from a LRS to HRS is indicated by dashed line 128. Detecting the state of the ReRAM cell while it is in its HRS is described above.

Overall, the ReRAM cell may be switched back and forth between its LRS and HRS many times. Read operations may be performed in each of these states (between the switching operations) one or more times or not performed at all. It should be noted that application of set and reset voltages to change resistance states of the ReRAM cell involves complex mechanisms that are believed to involve localized resistive heating as well as mobility of defects impacted by both temperature and applied potential.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$). ReRAM cells should be able to cycle between LRS and HRS between at least about $10^3$ times or, more specifically, at least about $10^7$ times without failure. A data retention time ($t_{RET}$) should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm$^2$ measured at 0.5 V per 20 Å of oxide thickness in HRS.

Examples of ReRAM Cells

Figure 3A:
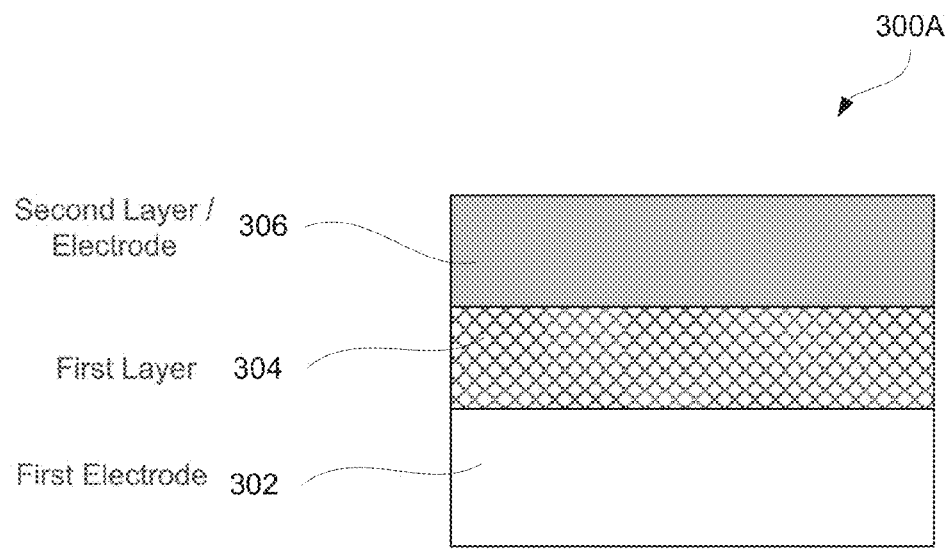
FIG. 3A illustrates a schematic representation of a single-layered metal-oxide stack of ReRAM cell, in accordance with some embodiments.

FIG. 3A illustrates a schematic representation of a single-layered metal-oxide stack of ReRAM cell 300A, in accordance with some embodiments. ReRAM cell 300A may include first electrode 302, first layer 304, and second layer 306 formed over the first layer 304. In some embodiments, first layer 304 directly interfaces with second layer 306. Alternatively, another layer may be disposed between first layer 304 and second layer 306 as further described below with reference to FIG. 3B. First layer 304 may be operable as a resistive switching layer. Second layer 306 may be operable as an electrode and, as such, may be referred to as a second electrode. As such, a resistive switching layer is disposed between two electrodes. Other components of ReRAM cell 300 may include, but not limited to a current steering element, embedded resistor, and intermediate electrode. The "first" and "second" terminology is used herein only for differentiating reasons and does not imply any deposition order or spatial orientation of the layers unless specifically noted.

First electrode 302 is made from one or more conductive materials such as titanium nitride, tantalum nitride, platinum, or any other suitable material. As stated above, second layer 306 may be operative as a second electrode. Similar to the first electrode 302, second layer 306 can be made from one or more conductive materials including, for example, titanium nitride, tantalum nitride, platinum, or any other suitable material. First electrode 302 and second layer 306 may be between about 5 nm and about 500 nm thick or, more specifically, between about 10 nm and about 100 nm thick.

First layer 304 includes a first dielectric material and a second dielectric material. The dielectric constant of the first dielectric material is less than the dielectric constant of the second dielectric material. In some embodiments, the dielectric constant of the first dielectric material can be about 20 or more. The dielectric constant of the second dielectric material is at least about 20, and in some embodiments, the dielectric constant of the second dielectric material is about 40.

Furthermore, the concentration of the first dielectric material in first layer 304 is greater than the concentration of the second dielectric material in the same layer. For example, the concentration of the first dielectric may be three times greater. In some embodiments, the concentration ratio of the first dielectric material to the second dielectric material in first layer 304 is between about 3 and 7 or, more specifically, between about 2 and 5.

In some embodiments, the first dielectric material is hafnium oxide. The second dielectric material may be one of titanium oxide or tantalum oxide, or a combination thereof. At least one of the first dielectric material or the second dielectric material may include a non-stoichiometric oxide. The thickness of the first layer 304 is between about 20 Angstroms and 100 Angstroms or, more specifically, between about 30 Angstroms and 50 Angstroms.

First layer 304 may be a nanolaminate formed by two or more sub-layers. In some embodiments, first layer 304 may include more than one nanolaminate structure formed by one or more sub-layers. In particular, each nanolaminate structure of first layer 304 may include at least one first layer of the first dielectric material (referred herein as to a first oxide layer) and at least one second layer of the second dielectric material (referred herein as to a second oxide layer). For example, each nanolaminate structure may include one or more hafnium oxide layers and one or more titanium oxide (or tantalum oxide) layers. The nanolaminate structures may vary based on the number of first oxide layers and second oxide layers and/or distribution of these layers within each structure. The number of each first oxide layer and second oxide layer forming a nanolaminate structure of first layer 304 may be one, two, three, four, five, or more. In general, any number of each type of layers may be presented in first layer 304.

Each nanolaminate structure in first layer 304 has a specific targeted average atomic ratio of the first dielectric material (e.g., hafnium oxide) to the second dielectric material (e.g., titanium oxide). This ratio may be determined by the number of first oxide layers and the number of second oxide layers. In one example embodiment, at least two nanolaminate structures in first layer 304 have different average atomic ratios of the first dielectric material to the second dielectric material. For example, a first nanolaminate structure of first layer 304 may have three first oxide layers and three second oxide layers, while a second nanolaminate structure of first layer 304 may have two first oxide layers and six second oxide layers. As such, the average atomic ratio of the first dielectric material to the second dielectric material in the first nanolaminate structure is less than in the second nanolaminate structure.

In general, the number of first dielectric layers and second dielectric layers can vary in each nanolaminate structure. For example, the ratio of first dielectric layers to second dielectric layers can be 1:1. In another example, the ratio of first dielectric layers to second dielectric layers can be 5:1. In yet another example, the ratio of first dielectric layers to second dielectric layers can be 7:1. For purposes of this document, an atomic ratio of the first dielectric material to the second dielectric material is considered as an average for the entire volume of each nanolaminate structure of first layer 304. It would be understood by one having ordinary skills in the art that the atomic ratio of the first dielectric material to the second dielectric material may fluctuate within the volume of the first layer 304 depending on the forming order of first oxide layers and second oxide layers, subsequent annealing operations that result in intermixing of these layers, and other factors.

When a nanolaminate structure is formed by one or more first dielectric layers and one or more second dielectric layers, annealing may be used to more uniformly distribute the two dielectric materials. In some embodiments, one or more first dielectric layers and one or more second dielectric layers may be arranged in a nanolaminate structure in such a way that the distribution of both dielectric materials is uniform, at least on average. There may be some local concentration variations of from one dielectric layer to another, at least prior to annealing. For example, when a nanolaminate structure has the same number of first dielectric layers and second dielectric layers, these layers may have substantially the same thickness. Furthermore, these two types of layers may alternate in the nanolaminate structure. Alternatively, first dielectric layers and second dielectric layers may be arranged in each nanolaminate structure in such a way that the distribution of the first dielectric to the second dielectric in the nanolaminate structure is gradual. This gradual distribution of the two dielectric materials may be used to change properties at different interfaces of first layer 304.

Figure 3B:
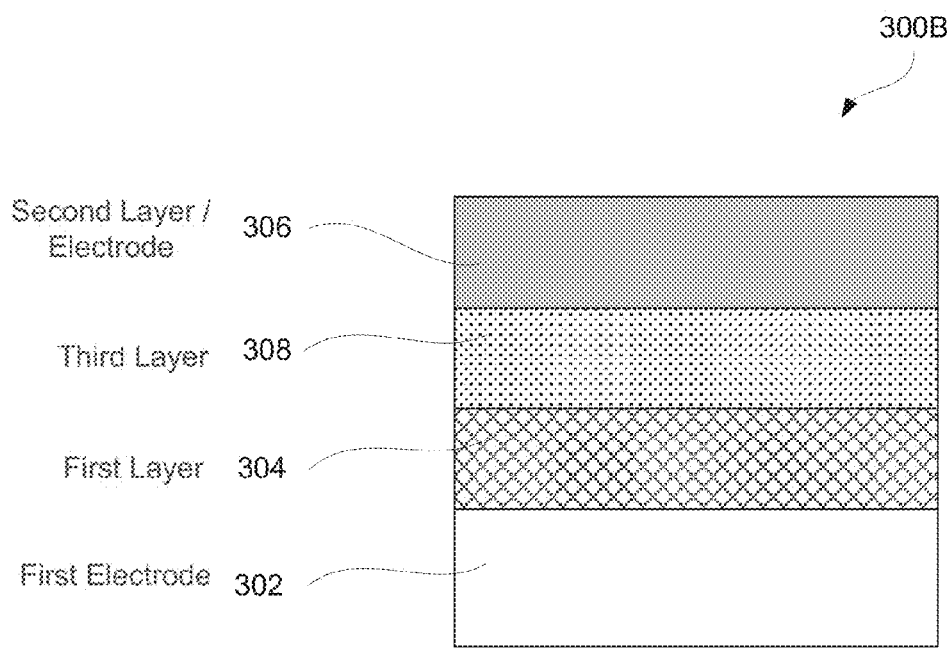
FIG. 3B illustrates a schematic representation of a bi-layered metal-oxide stack of ReRAM cell, in accordance with some embodiments.

FIG. 3B illustrates a schematic representation of a bi-layered dielectric stack used as a resistive switching layer of ReRAM cell 300B, in accordance with some embodiments. As shown in this figure, ReRAM cell 300B includes first electrode 302, first layer 304, second layer 306, and third layer 308. Similar to FIG. 3A, second layer 306 may be operable as an electrode and may be referred to as a second electrode in order to distinguish it from first electrode 302. However, in the example shown in FIG. 3B, third layer 308 is formed over first layer 304 such that third layer 308 is disposed between second layer 306 and first layer 304. Various aspects of first electrode 302, first layer 304, and second layer 306 are described above with reference to FIG. 3A.

One of first layer 304 and third layer 308 or a combination of first layer 304 and third layer 308 may be operable as a resistive switching layer. As discussed above, the resistive switching layer is responsible for switching between low and high resistive states. In some embodiments, third layer 308 includes a third dielectric material, such as silicon oxide. The third dielectric material may refer to a low-k dielectric material. Other examples of third dielectric materials may include spin-on silicon based polymeric dielectric material, spin-on organic polymeric dielectric material, or doped silicon oxide materials, such as fluorine-doped silicone dioxide, carbon-doped silicone dioxide, or hydrogen-doped silicone dioxide.

The dielectric constant of third dielectric material is less than the dielectric constant of the first dielectric material and, as such, less than the dielectric constant of the second dielectric material. For example, the dielectric constant of the third dielectric material may be at least three times less than the dielectric constant of the first dielectric material.

The thickness of third layer 308 may be less than the thickness of the second layer 306. For example, the thickness of third layer 308 is less than 100 Angstroms. In yet more embodiments, the thickness of third layer 308 is between about 5 Angstroms and 20 Angstroms.

One of first layer 304 and third layer 308 or a combination of first layer 304 and third layer 308 may be a nanolaminate structure formed by the first dielectric material, second dielectric material, and third dielectric material. Distribution of the three dielectric materials in such a nanolaminate structure may be non-uniform. Specifically, a more of the third dielectric material may be positioned on one side (defined by the thickness of the nanolaminate structure) than on the other side. As such, the portion with the higher concentration of the third dielectric material may be referred to as third layer 308, while the portion of with the lower concentration of the third dielectric may be referred to as first layer 304. In some embodiments, third layer 308 is substantially free from the first dielectric material and/or the second dielectric material. Alternatively, third layer 308 includes one or both of the first dielectric material and second dielectric material. In this case, the first dielectric material and/or second dielectric material may form a nanolaminate together with the third dielectric material. In some embodiments, first layer 304 is substantially free from the third dielectric material. Alternatively, first layer 304 includes the third dielectric material. In this case, the first dielectric material and second dielectric material may form a nanolaminate together with the third dielectric material. As already discussed above with reference to FIG. 3A, first layer 304 may include one or more nanolaminate structures formed by one or more first dielectric layer and one or more second dielectric layers.

Processing Examples

Figure 4:
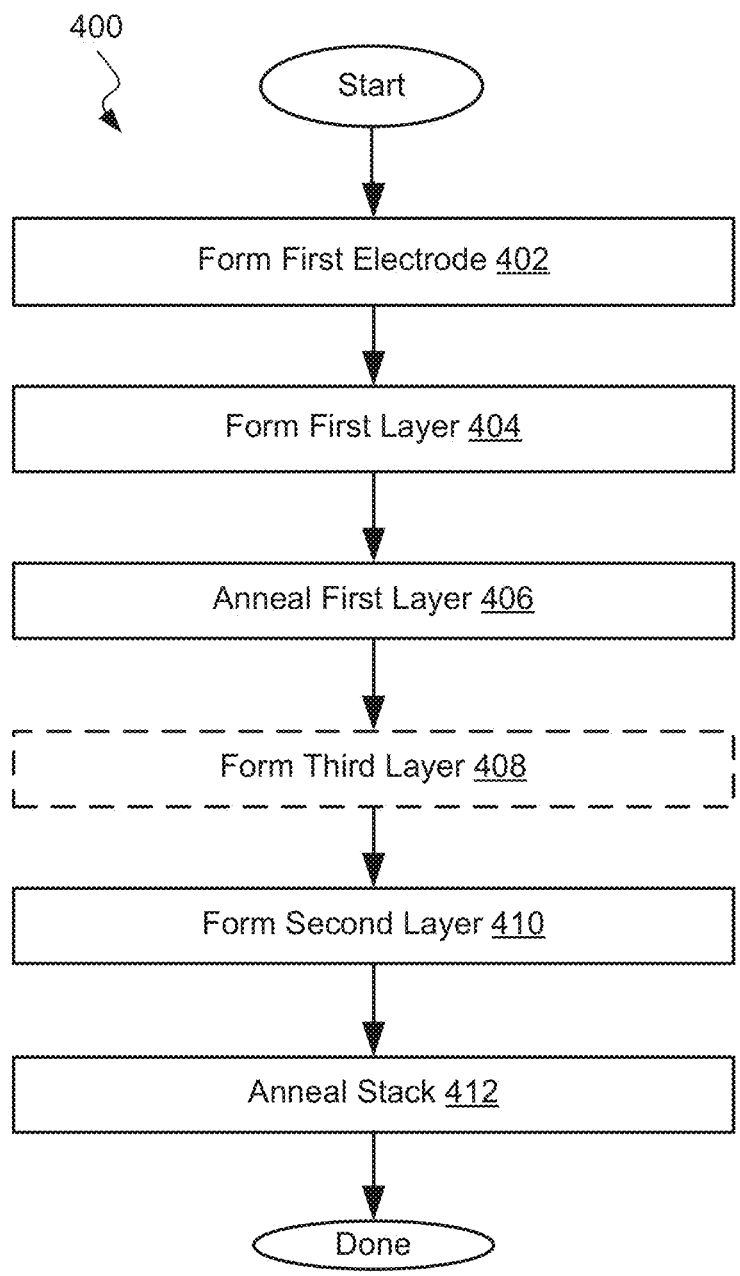
FIG. 4 illustrates a process flowchart corresponding to a method of fabricating a ReRAM cell including an embedded resistor, in accordance with some embodiments.

FIG. 4 illustrates a process flowchart corresponding to method 400 of fabricating a ReRAM cell, in accordance with some embodiments. Various examples of ReRAM cells are described above with reference to FIG. 3A and FIG. 3B. Method 400 may commence with forming a first electrode during operation 402. The first electrode may include titanium nitride, tantalum nitride, or a combination thereof. The first electrode may optionally be formed on a substrate using sputtering, physical vapor deposition (PVD), ALD, CVD or other suitable techniques.

In some embodiments, operation 402 may be performed using a titanium target or a tantalum target in a nitrogen atmosphere maintained at a pressure of between about 1-20 mTorr. The power density may be maintained at 3.3-11 W/cm$^2$ that may result in a deposition rate of about 0.5-5 Angstroms per second. Some of the provided process parameters are for illustrative purposes only and generally depend on deposited materials, tools, deposition rates, and other factors.

Method 400 may proceed with forming a first layer during operation 404. The first layer may be formed using atomic layer deposition (ALD) or chemical vapor deposition (CVD). The first layer includes a first dielectric material, such as hafnium oxide, and a second dielectric material such as titanium oxide or tantalum oxide. The dielectric constant of the first dielectric material is less than the dielectric constant of the second dielectric material. Furthermore, the concentration of the first dielectric material in the first dielectric layer is greater than the concentration of the second dielectric material in the first dielectric layer as discussed above.

The first layer may be formed by creating a nanolaminate structure having several sub-layers such as one or more first oxide layers (e.g., hafnium oxide layers) and one or more second oxide layers (e.g., titanium oxide layers or tantalum oxide layers). In some embodiments, the first layer may include multiple nanolaminate structures, each of which has one or more first oxide layers and one or more second oxide layers.

In some embodiments, the first layer is formed using ALD. A separate ALD cycle may be used to form a first oxide layer. Likewise, a separate ALD cycle may be used to form a second oxide layer. One or both of these ALD cycles may be repeated to form a required number of first and second oxide layers in each nanolaminate structure. Furthermore, the order of these ALD cycles determines the positions of the first and second oxide layers within each nanolaminate structure.

In general, each ALD cycle involves the following four steps: introducing one or more precursors into the deposition chamber to form an adsorbed layer, followed by purging the unadsorbed precursor and any superfluous by-products from the chamber, and then introducing reactive agents that will react with the adsorbed layer to form a portion of or the entire oxide layer, followed by purging the unreacted reactive agents and any superfluous by-products from the chamber. Selection of precursors and processing conditions depend on desired composition, morphology, and structure of each portion of the electrode.

A layer formed during each ALD cycle described above may be between about 0.25 and 2 Angstroms thick, averaged over the area of the layer. The ALD cycle may be repeated multiple times until the overall base layer (and subsequently the resistive switching layer) reaches it desired thickness. In some embodiments, ALD cycles are repeated using different precursors.

ALD techniques are now briefly described to provide better understanding of various processing features. A precursor containing the first dielectric material or the second dielectric material is introduced into the ALD chamber and allowed to flow over the substrate surface (which may be a top surface of a previously deposited ALD layer). The precursor may be introduced in the form of a pulse. Further, the introduced precursor adsorbs (e.g., saturatively chemisorbs or physisorbs) on the deposition surface. Subsequent purging with a purging gas removes unreacted precursors, reaction products, and other undesirable components from the chamber.

In some embodiments, purging is performed before full saturation of the substrate surface occurs with the precursors. In other words, additional precursor molecules could have been further adsorbed on the substrate surface if the purging was not initiated so early. Without being restricted to any particular theory, it is believed that partial saturation can be used to introduced defects into the formed layer, e.g., during forming of a resistive switching layer.

After the initial precursor pulsing and purging of one or more precursors for the first or second element, a subsequent pulse introduces an oxidizing agent. The oxidizing agent reacts with the adsorbed element to form oxides. Reaction byproducts and excess reactants are purged from the deposition chamber. The saturation during the reaction and purging stages makes the growth self-limiting. This feature helps to improve deposition uniformity and conformality and allows more precise control of the resulting resistive switching characteristics.

The temperature of the substrate during atomic layer deposition may be between about 200° C. to 350° C. The precursor may be either in gaseous phase, liquid phase, or solid phase. If a liquid or solid precursor is used, then it may be transported into the chamber an inert carrier gas, such as helium or nitrogen.

Some examples of hafnium containing precursors include bis(tert-butylcyclopentadienyl)dimethyl hafnium ($C_{20}H_{32}Hf$), bis(methyl-η5-cyclopentadienyl)methoxymethyl hafnium ($HfCH_3(OCH_3)[C_5H_4(CH_3)]_2$), bis(trimethylsilyl)amido hafnium chloride ($[[(CH_3)_3Si]_2N]_2HfCl_2$), dimethylbis(cyclopentadienyl)hafnium ($(C_5H_5)_2Hf(CH_3)_2$), hafnium isopropoxide isopropanol adduct ($C_{12}H_{28}HfO_4$), tetrakis(diethylamido)hafnium ($[(CH_2CH_3)_2N]_4Hf$)—also known as TEMAH, tetrakis(ethylmethylamido)hafnium ($[(CH_3)(C_2H_5)N]_4Hf$), tetrakis(dimethylamido)hafnium ($[(CH_3)_2N]_4Hf$)—also known as TDMAH, and hafnium tert-butoxide (HTB). Some hafnium containing precursors can be represented with a formula (RR'N) 4Hf, where R and R' are independent hydrogen or alkyl groups and may be the same or different. Some examples of aluminum containing precursors include aluminum tris(2,2,6,6-tetramethyl-3,5-heptanedionate) ($Al(OCC(CH3)_3CHCOC(CH_3)_3)_3$), tri-isobutyl aluminum ($[(CH_3)_2CHCH_2]_3Al$), trimethyl aluminum ($(CH_3)_3Al$)—also known as TMA, Tris(dimethyl amido)aluminum ($Al(N(CH_3)_2)_3$). Some examples of titanium containing precursors include titanium chloride ($TiCl4$), titanium iodine ($TiI4$), bis(tert-butylcyclopentadienyl)titanium dichloride ($C_{18}H_{26}Cl_2Ti$), bis(diethylamido) bis(dimethylamido)titanium ($Ti(N(CH_3)_2)_2(N(CH_2CH_3)_2)_2$), tetrakis(diethylamido)titanium ($[(C_2H5)_2N]_4Ti$), tetrakis(dimethylamido)titanium ($[(CH_3)_2N]_4Ti$), tetrakis(ethylmethylamido)titanium ($[(CH_3C_2H_5)N]_4Ti$), titanium diisopropoxidebis(2,2,6,6-tetramethyl-3,5-heptanedionate) ($Ti[OCC(CH_3)_3CHCOC(CH_3)_3]_2(OC_3H_7)_2$), and titanium isopropoxide ($Ti[OCH(CH_3)_2]_4$). Some example of tantalum containing precursors include pentakis(dimethylamino)tantalum ($Ta(N(CH_3)_2)_5$), tris(diethylamido)(tert-butylimido) tantalum ($(CH_3)_3CNTa(N(C_2H_5)_2)_3$), tris(diethylamido) (ethylimido)tantalum ($C_2H_5NTa(N(C_2H_5)_2)_3$), tris (ethylmethylamido)(tert-butylimido)tantalum ($C_{13}H_{33}N_4Ta$). Examples of zirconium containing precursors include bis(cyclopentadienyl)zirconium(IV) dihydride ($C_{10}H_{12}Zr$), bis (methyl-η5-cyclopentadienyl)methoxymethylzirconium ($Zr(CH_3C_5H_4)_2CH_3OCH_3$), dimethylbis (pentamethylcyclopentadienyl)zirconium ($C_{22}H_{36}Zr$), tetrakis(diethylamido)zirconium ($[(C_2H_5)_2N]_4Zr$), tetrakis (dimethylamido)zirconium ($[(CH_3)_2N]_4Zr$), tetrakis (ethylmethylamido)zirconium ($Zr(NCH_3C_2H_5)_4$), zirconium dibutoxide(bis-2,4-pentanedionate) ($C_{18}H_{32}O_6Zr$), zirconium diisopropoxidebis(2,2,6,6-tetramethyl-3,5-heptanedionate) ($Zr(OCC(CH_3)_3CHCOC(CH_3)_3)_2(OC_3H_7)_2$), zirconium 2-ethylhexanoate ($Zr(C_8H_{15}O_2)_4$), zirconium tetrakis(2,2,6,6-tetramethyl-3,5-heptanedionate) ($Zr(OCC(CH_3)_3CHCOC(CH_3)_3)_4$).

The oxidizing agent may include water ($H_2O$), peroxides (organic and inorganic, including hydrogen peroxide $H_2O_2$), oxygen ($O_2$), ozone ($O_3$), oxides of nitrogen (NO, $N_2O$, $NO_2$, $N_2O_5$), alcohols (e.g., ROH, where R is a methyl, ethyl, propyl, isopropyl, butyl, secondary butyl, or tertiary butyl group, or other suitable alkyl group), carboxylic acids (RCOOH, where R is any suitable alkyl group as above), and radical oxygen compounds (e.g., O, $O_2$, $O_3$, and OH radicals produced by heat, hot-wires, and/or plasma).

The ALD cycles repeated until the entire nanolaminate structure is formed. As noted above, one or more nanolaminate structures of first layer 304 include at least one oxide layer and at least one second oxide layer. Therefore, each operation 404 may include at least two ALD cycles; one to deposit a first oxide layer and one to deposit a second oxide layer. Overall, the number of cycles, precursors used in each cycle, and processing conditions of each cycle is determined by the design of each nanolaminate structure as described above.

Furthermore, operation 404 is repeated at least once to form an additional nanolaminate structure. At least some conditions of operation 404 are changed at least once to ensure that average atomic ratios of the first dielectric material to the second dielectric material in two of the nanolaminate structures in the first layer are different.

Method 400 may proceed with annealing the first layer during operation 406. Annealing may be performed in a first environment including an oxygen source after operation 404 is completed. Alternatively, annealing during operation 406 may be performed concurrently with operation 404. For example, forming the first layer may involve depositing one or more first dielectric layers and one or more second dielectric layers. Initial annealing may be performed after some but not all of these layers are formed. Additional annealing may be performed after all layers are formed.

In some embodiments, annealing the first layer is performed at a temperature of between about 500° C. and 700° C. In some embodiments, annealing is performed for a period of about 10 seconds and 10 minutes, and more specifically, for about 1 minute. The oxygen source present in the first environment may be molecular oxygen. As those skilled in the art will appreciate, the annealing in presence of oxygen source can assist with oxidizing and forming the first dielectric material and/or the second dielectric material in the first layer.

In some embodiments, method 400 may proceed with forming another layer, which may be referred to as a third layer, during optional operation 408. The third layer, if one is formed, may be formed before the second layer, which is formed during operation 410. The third layer includes a third dielectric material such as a low-k dielectric material. In one example embodiment, the third dielectric material includes silicon oxide. The dielectric constant of the third dielectric material is less than the dielectric constant of the first dielectric material. In some embodiments, the third layer is formed using ALD. This process may include one or more ALD cycles depending on specific requirements, e.g., forming a nanolaminate structure of the third layer.

In some embodiments, operation 408 may optionally include annealing process after or during one or more ALD cycles are completed. For example, annealing of the third layer can be performed at a temperature of between about 500° C. and 700° C. The annealing can be also performed in presence of oxygen source similar to operation 406.

Method 400 may further proceed with forming a second layer during operation 410. In some embodiments, the second layer is formed directly over the first layer such that the second layer directly interfaces with the first layer 304 (as shown in FIG. 3A). In this case, operation 408 may not be performed. Alternatively, the second layer is formed directly over the third layer such that the second layer directly interfaces with the third layer, and the third layer is disposed between the first layer and second layer (as shown in FIG. 3B).

In some embodiments, the second layer serves as a second electrode. For this reason, the second layer may be formed from tantalum nitride, titanium nitride or any other conductive material. Furthermore, the second layer may be formed using a variety of technologies, including, but not limited to, ALD, CVD, PVD, thermal evaporation, and so forth. The thickness of second layer may be between about 10 nm and 100 nm.

In some embodiments, the second layer may be deposited in the same manner as the first electrode as described above with reference to operation 402. Other layers, such as interface or capping layers, current limiting layers, and other layer may be deposited in the stack, e.g., between the second layer and first layer and/or between the first electrode and first layer.

Finally, method 400 may proceed with annealing the entire stack including at least the first layer, second layer, and optionally the third layer during operation 412. Annealing is performed in a second environment including a nitrogen source. In some embodiments, operation 412 is performed after operation 410 is completed. Furthermore, annealing at operation 412 can be performed at temperatures of about 700° C. and 800° C. In some embodiments, annealing is performed during a period of about 10 seconds and 10 minutes. In one example, the annealing during operation 412 is performed at a temperature of about 750° C. for about 1 minute in the second environment. As will be appreciated by those skilled in the art, the presence of nitrogen in the second environment can assist in forming titanium nitride or tantalum nitride during annealing process.

Memory Array Examples

Figure 5A:
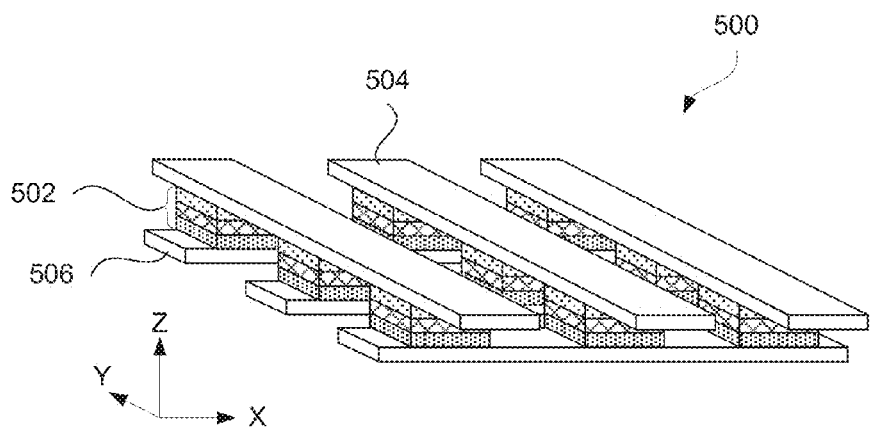
FIGS. 5A and 5B illustrate schematic views of memory arrays including multiple ReRAM cells, in accordance with some embodiments.

A brief description of memory arrays will now be described with reference to FIGS. 5A and 5B to provide better understanding to various aspects of thermally isolating structures provided adjacent to ReRAM cells and, in some examples, surrounding the ReRAM cells. ReRAM cells described above may be used in memory devices or larger integrated circuits (IC) that may take a form of arrays. FIG. 5A illustrates a memory array 500 including nine ReRAM cells 502, in accordance with some embodiments. In general, any number of ReRAM cells may be arranged into one array. Connections to each ReRAM cell 502 are provided by signal lines 504 and 506, which may be arranged orthogonally to each other. ReRAM cells 502 are positioned at crossings of signal lines 504 and 506 that typically define boundaries of each ReRAM cell in array 500.

Signal lines 504 and 506 are sometimes referred to as word lines and bit lines. These lines are used to read and write data into each ReRAM cell 502 of array 500 by individually connecting ReRAM cells to read and write controllers. Individual ReRAM cells 502 or groups of ReRAM cells 502 can be addressed by using appropriate sets of signal lines 504 and 506. Each ReRAM cell 502 typically includes multiple layers, such as first and second electrodes, resistive switching layer, embedded resistors, embedded current steering elements, and the like, some of which are further described elsewhere in this document. In some embodiments, a ReRAM cell includes multiple resistive switching layers provided in between a crossing pair of signal lines 504 and 506.

As stated above, various read and write controllers may be used to control operations of ReRAM cells 502. A suitable controller is connected to ReRAM cells 502 by signal lines 504 and 506 and may be a part of the same memory device and circuitry. In some embodiments, a read and write controller is a separate memory device capable of controlling multiple memory devices each one containing an array of ReRAM cells. Any suitable read and write controller and array layout scheme may be used to construct a memory device from multiple ReRAM cells. In some embodiments, other electrical components may be associated with the overall array 500 or each ReRAM cell 502. For example, to avoid the parasitic-path-problem, i.e., signal bypasses by ReRAM cells in their low resistance state (LRS), serial elements with a particular non-linearity must be added at each node or, more specifically, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

Figure 5B:
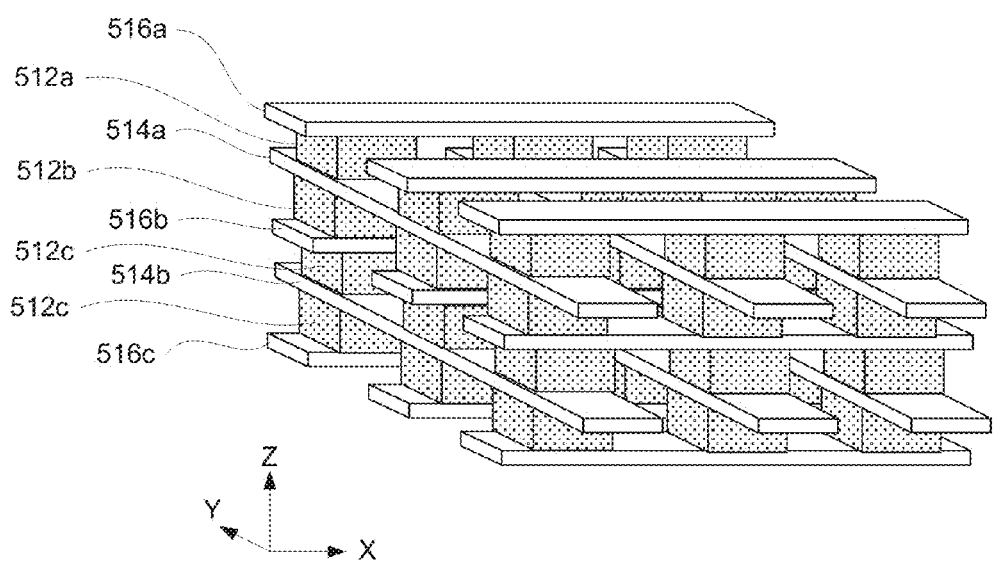

In some embodiments, a memory device may include multiple array layers as, for example, illustrated in FIG. 5B. In this example, five sets of signal lines 514a-b and 516a-c are shared by four ReRAM arrays 512a-c. As with the previous example, each ReRAM array is supported by two sets of signal lines, e.g., array 512a is supported by 514a and 516a. However, middle signal lines 514a-b and 516b, each is shared by two sets ReRAM arrays. For example, signal line set 514a provides connections to arrays 512a and 512b. First and second sets of signal lines 516a and 516c are only used for making electrical connections to one array. This 3-D arrangement of the memory device should be distinguished from various 3-D arrangements in each individual ReRAM cell.

Experimental Results

Multiple various single-layer ReRAM cells, such as shown in FIG. 3A, and multiple various bi-layer ReRAM stacks, such as shown in FIG. 3B, have been fabricated and tested. Table 1 below illustrates features of some ReRAM stacks and respective performance parameters. In particular, experiments No. 1, 2, 6, 10, and 14 used ReRAM cells having resistive switching layers made from hafnium oxide. These cells may be considered as reference cells. Experiments No. 3-5, 7-9, and 11-13 used ReRAM cells having resistive switching layers made from hafnium titanium oxide. Regardless of the composition, all resistive switching layers had a thickness of about 55 Angstroms. The composition of hafnium titanium oxide was also varied. For example, experiments 3, 7 and 11 used ReRAM cells that had a concentration ratio of hafnium oxide to titanium oxide of 2:3. This concentration ratio was achieved by forming 2× number of hafnium oxide layer and 3× number of titanium oxide layers. Experiments 4, 8 and 12 used ReRAM cells that had a concentration ratio of hafnium oxide to titanium oxide of 3:1. Finally, experiments 5, 9 and 13 used ReRAM cells that had a concentration ratio of hafnium oxide to titanium oxide of 5:1.

The ReRAM cells from experiments 1 and 2 where not annealed in an oxygen containing environment. All other cells have been annealed at about 500° C. in an oxygen containing environment prior to forming a top electrode. It should be noted that all ReRAM cells have been subjected to annealing in a nitrogen environment after all components have been formed. However, different annealing temperatures have been used. Experiments 1 and 3-10 used at a temperature of about 500° C. for final nitrogen annealing. Experiments 2 and 11-14 used at a temperature of about 750° C. for the same type of final anneal.

ReRAM cells were tested with (experiments 1-6 and 11-14) and without (experiments 7-10) silicon oxide layers.

If a silicon oxide layer is formed between a hafnium oxide layer (or a hafnium titanium nitride layer) and top electrode, the thickness of the silicon oxide layer was about 10 Angstroms.

In all experiments, once ReRAM cells were fabricated, a forming voltage and yield percentage were determined for type of cell. Table 1 shows the results of these experiments.

TABLE 1

| Experiment Number | Composition HfOx:TiOx | Oxygen Anneal | SiOx | Nitrogen Anneal | Forming Voltage | % Yield |
|---|---|---|---|---|---|---|
| 1 | 55 Å HfOx | None | 10 Å SiO$_2$ | 500° C. | 3.5 | 0 |
| 2 | 55 Å HfOx | None | 10 Å SiO$_2$ | 750° C. | 4 | 30 |
| 3 | 55 Å 2:3 HfTiO | 500° C. | 10 Å SiO$_2$ | 500° C. | 5.5 | 0 |
| 4 | 55 Å 3:1 HfTiO | 500° C. | 10 Å SiO$_2$ | 500° C. | 6.5 | 10 |
| 5 | 55 Å 5:1 HfTiO | 500° C. | 10 Å SiO$_2$ | 500° C. | 4 | 50 |
| 6 | 55 Å HfOx | 500° C. | 10 Å SiO$_2$ | 500° C. | 4.5 | 30 |
| 7 | 55 Å 2:3 HfTiO | 500° C. | None | 500° C. | 3 | 0 |
| 8 | 55 Å 3:1 HfTiO | 500° C. | None | 500° C. | 3.5 | 10 |
| 9 | 55 Å 5:1 HfTiO | 500° C. | None | 500° C. | 4 | 10 |
| 10 | 55 Å HfOx | 500° C. | None | 500° C. | 1.5 | 10 |
| 11 | 55 Å 2:3 HfTiO | 500° C. | 10 Å SiO$_2$ | 750° C. | 4 | 50 |
| 12 | 55 Å 3:1 HfTiO | 500° C. | 10 Å SiO$_2$ | 750° C. | 5 | 40 |
| 13 | 55 Å 5:1 HfTiO | 500° C. | 10 Å SiO$_2$ | 750° C. | 4 | 40 |
| 14 | 55 Å HfOx | 500° C. | 10 Å SiO$_2$ | 750° C. | 4.5 | 40 |

The experimental results show some reduction in forming voltage and increase in overall yield when titanium oxide is added to hafnium oxide. Without being restricted to any particular theory, it is believed that that doping hafnium oxide with a metal, such as titanium, likely increases the polarization of the dielectric. Moreover, doping hafnium oxide with titanium or another transition metal likely suppresses the material crystallinity, which results in increase of the overall leakage currents in the resistive switching layer. Furthermore, the highest yield values (of 50%) were achieved when a silicon oxide layer was added.

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method of fabricating a memory cell, the method comprising:
   forming a first layer using atomic layer deposition (ALD) or chemical vapor deposition (CVD),
      wherein the first layer comprises a first dielectric material and a second dielectric material arranged into a nanolaminate of sub-layers comprising the first dielectric material and sub-layers comprising the second dielectric material,
      wherein a dielectric constant of the first dielectric material is less than a dielectric constant of the second dielectric material,
      wherein a concentration of the first dielectric material in the first layer is greater than a concentration of the second dielectric material in the first layer;
   annealing the first layer in a first environment comprising an oxygen source;
   after annealing the first layer in the first environment, forming a second layer over the first layer,
      wherein the second layer is operable as an electrode; and
   annealing the first layer and the second layer in a second environment comprising a nitrogen source,
      wherein, after annealing, distribution of the first dielectric material and distribution of the second dielectric material within the first layer are both uniform,
      wherein the memory cell is operable to switching between two resistive states when a switching signal is applied to the memory cell.

2. The method of claim 1, wherein the second layer is formed directly over the first layer such that the second layer directly interfaces the first layer.

3. The method of claim 1, further comprising, prior to forming the second layer, forming a third layer over the first layer such that the third layer is disposed between the second layer and the first layer, wherein the third layer comprises a third dielectric, and wherein a dielectric constant of the third dielectric material is less than the dielectric constant of the first dielectric material.

4. The method of claim 3, wherein the dielectric constant of the third dielectric material is at least three times less than the dielectric constant of the first dielectric material.

5. The method of claim 3, wherein the third dielectric material comprises silicon oxide.

6. The method of claim 3, wherein a thickness of the third layer is less than a thickness of the second layer.

7. The method of claim 6, wherein the thickness of the third layer is between about 5 Angstroms and 20 Angstroms.

8. The method of claim 1, wherein the dielectric constant of the first dielectric material is at least about 20.

9. The method of claim 1, wherein the first dielectric material is hafnium oxide.

10. The method of claim 1, wherein the second dielectric material is one of titanium oxide or tantalum oxide.

11. The method of claim 1, wherein a thickness of the first layer is between about 20 Angstroms and 100 Angstroms.

12. The method of claim 1, wherein a concentration ratio of the first dielectric material to the second dielectric material in the first layer is between about 3 and 7.

13. The method of claim 1, wherein the first layer is formed using ALD, and wherein forming the first layer comprises forming one of more sub-layers of the first dielectric material and one or more sub-layers of the second dielectric material.

14. The method of claim 1, wherein the first layer is formed over a layer comprising titanium nitride and operable as a second electrode.

15. The method of claim 1, wherein the second layer comprises tantalum nitride.

16. The method of claim 1, wherein annealing the first layer in the first environment is performed at a temperature of between about 500° C. and 700° C.

17. The method of claim 16, wherein the oxygen source is molecular oxygen.

18. The method of claim 1, wherein annealing the first layer and the second layer in the second environment is performed at a temperature of about 700° C. and 800° C.

19. The method of claim 1, wherein at least one of the first dielectric material or the second dielectric material comprises a non-stoichiometric oxide.

20. A method of fabricating a memory cell, the method comprising:
   forming a first layer using atomic layer deposition (ALD) over a layer comprising titanium nitride and operable as a first electrode,
      wherein the first layer comprises hafnium oxide and titanium oxide arranged into a nanolaminate of sub-layers comprising hafnium oxide and sub-layers comprising the titanium oxide,
      wherein a concentration ratio of hafnium oxide to titanium oxide in the first layer is between about 3 and 7, and
      wherein a thickness of the first layer is between about 20 Angstroms and 100 Angstroms;
   annealing the first layer in a first environment comprising molecular oxygen at a temperature of 500° C. for about 1 minute;
   after annealing the first layer in the first environment, forming a second layer over the first layer,
      wherein the second layer comprises silicon oxide and wherein a thickness of the second layer is between about 5 Angstroms and 20 Angstroms;
   after forming the second layer, forming a third layer over the second layer,
      the third layer comprising tantalum nitride and operable as a second electrode; and
   annealing the first layer, the second layer, and the third layer in a second environment comprising molecular nitrogen at a temperature of about 750° C. for about 1 minute,
      wherein, after annealing, distribution of hafnium oxide and distribution of titanium oxide within the first layer are both uniform.

* * * * *